United States Patent
Lee (10) Patent No.: US 8,054,979 B2
(45) Date of Patent: Nov. 8, 2011

(54) AUDIO SYSTEM FOR IMPROVING A SIGNAL TO NOISE RATIO

(75) Inventor: Jong-Hang Lee, Daejeon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 846 days.

(21) Appl. No.: 12/121,298

(22) Filed: May 15, 2008

(65) Prior Publication Data

US 2008/0285760 A1 Nov. 20, 2008

(30) Foreign Application Priority Data

May 16, 2007 (KR) .................. 10-2007-0047780

(51) Int. Cl.
*H04R 5/04* (2006.01)
*H03F 3/217* (2006.01)
(52) U.S. Cl. .......................... 381/1; 381/121
(58) Field of Classification Search ................ 381/1–10, 381/120–121
See application file for complete search history.

(56) References Cited

U.S. PATENT DOCUMENTS
5,848,168 A * 12/1998 Shipps et al. .............. 381/71.5
2009/0116654 A1* 5/2009 Hansen et al. ................ 381/28

FOREIGN PATENT DOCUMENTS
JP       2004-048333    2/2004
KR   1020050036812 A   4/2005
KR   1020050050608 A   5/2005
* cited by examiner

*Primary Examiner* — Cuong Q Nguyen
(74) *Attorney, Agent, or Firm* — F. Chau & Associates, LLC (57) ABSTRACT

An audio system performing a class-D amplification includes a first pulse width modulation (PWM) signal generation unit and a second PWM signal generation unit. The first PWM signal generation unit generates a first switching signal based on a first audio signal. The second PWM signal generation unit generates a second switching signal based on a second audio signal. The second switching signal has a frequency difference with respect to the first switching signal such that a harmonic frequency component generated by interference between the first switching signal and the second switching signal is removed. Accordingly, the audio system performing the class-D amplification may improve a signal to noise ratio by minimizing influence of the harmonic frequency components on the first and second switching signals.

18 Claims, 7 Drawing Sheets

AUDIO SYSTEM FOR IMPROVING A SIGNAL TO NOISE RATIO

CROSS-REFERENCE TO RELATED APPLICATION

This application claims priority under 35 USC §119 to Korean Patent Application No. 2007-0047780, filed on May 16, 2007 in the Korean Intellectual Property Office (KIPO), the disclosure of which is incorporated herein in its entirety by reference.

BACKGROUND OF THE INVENTION

1. Technical Field

The present disclosure relates to an audio system and, more particularly, to an audio system having an improved signal to noise ratio (SNR) and a method of controlling an audio system.

2. Discussion of Related Art

Audio amplifiers are typically classified as either class-A, class-B, class-AB, or class-D according to a driving circuit of the audio amplifier known as the output stage.

In the class-A output stage, bias voltages are applied to output transistors in a mute state, in which no signal is output, and a bias current flows through the output transistors in the mute state. Thus, the class-A output stage has high thermal dissipation and low thermal efficiency. The class-B output stage is configured to prevent the bias current in the mute state. Significant crossover distortion, however, is caused in the class-B output stage when the output signal passes through a reference voltage, that is, when the output transistors are turned off. The class-AB output stage is configured to have a small bias current in the mute state to achieve the lower distortion of the class-A configuration and the higher efficiency of the class-B configuration. The crossover distortion, however, still exists and a high-capacity heat sink is required in the class-AB output stage.

The class-D output stage includes transistors operating as an ON/OFF switch. A turn-on resistance of the transistors is relatively small, and thus the class-D output stage has a high efficiency. According to an IEC (International Electrotechnical Commission) standard, the class-D amplifier is defined as any amplifier, "in which the current in each active device supplying the load is switched from zero to a maximum value by a carrier signal, modulation of which conveys the useful signal." Accordingly the class-D output stage includes all of the output stages, that is, the driving circuits are operated by a switching amplification regardless of whether an analog input or a digital input is received and regardless of the types of the internal signal processes used. The audio amplifiers including such a class-D output stage or a class-D driving circuit are referred to as digital amplifiers or digital amps.

Because of superior characteristics of the class-D amplifier, numerous audio systems reproduce sounds from audio signals by using the class-D amplifier. Recently, according to demands of users, audio systems generally include at least two amplifiers for playing stereo audio signals.

Figure 1:
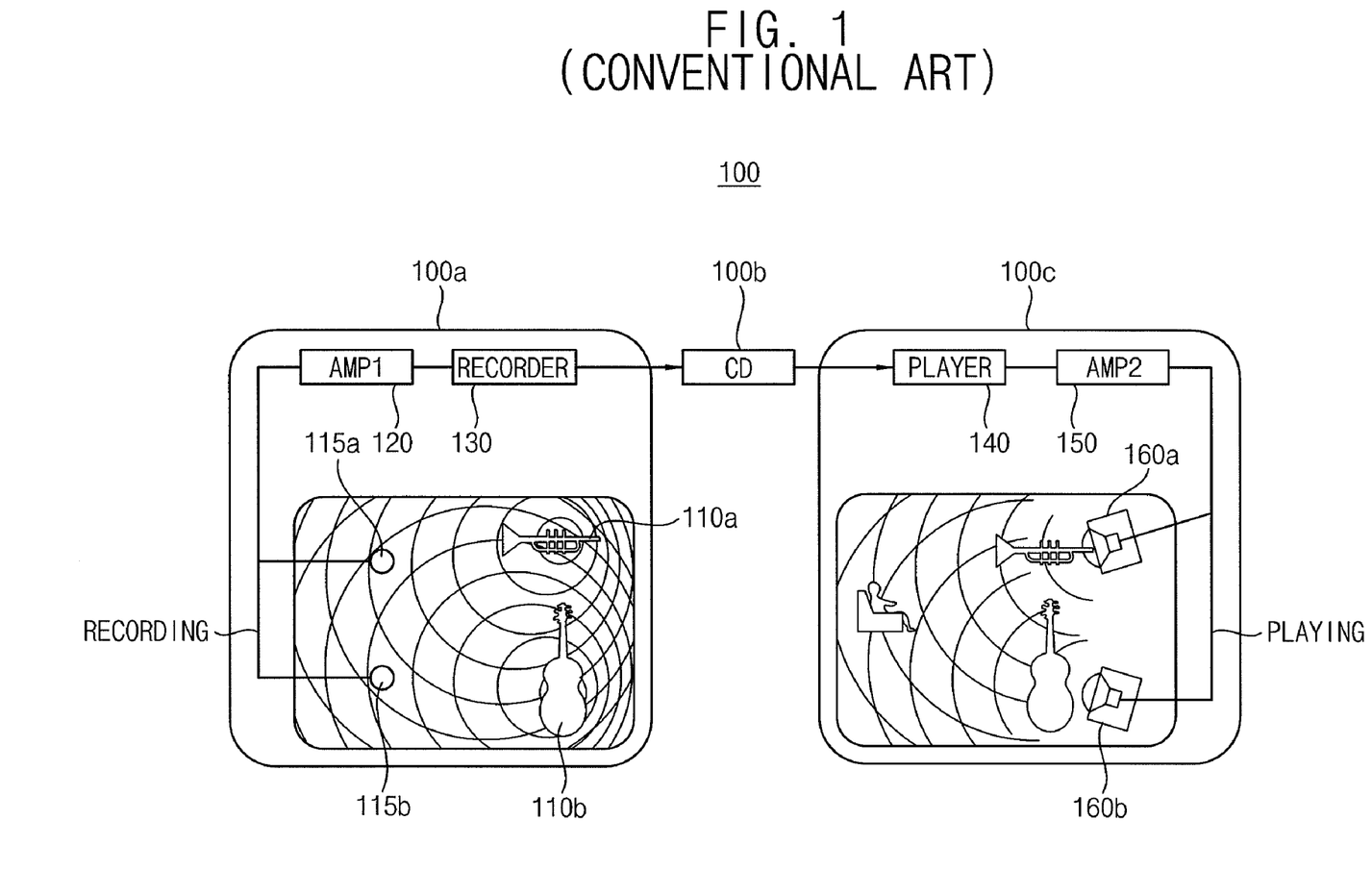
FIG. 1 is a diagram illustrating a conventional system for recording and playing a stereo audio signal.

FIG. 1 is a diagram illustrating a system 100 for recording and playing a stereo audio signal.

In a device 100a for recording stereo audio signals, at least two microphones 115a and 115b receive sounds from sound sources 110a and 110b. A first amplifier 120 amplifies the received sounds and a recorder 130 records the amplified sounds and stores the recorded sounds in a storage device 100b, such as a compact disc (CD).

In a device 100c for playing the recorded stereo audio signals, a player 140 outputs the signals based on data in the storage device 100b, such as the CD, using at least two independent audio channels. A second amplifier 150 may amplify the outputted signals and speakers 160a and 160b convert the amplified signals to sound waves.

Although at least two independent audio channels have substantially identical structure, a signal to noise ratio (SNR) may be degraded by interference between the class-D channels when noises occur in the audio band of 20 Hz to 200 kHz.

SUMMARY OF THE INVENTION

Accordingly, exemplary embodiments of the present invention are provided to substantially obviate one or more problems due to limitations and disadvantages of the related art.

Exemplary embodiments of the present invention provide an audio system capable of improving a signal to noise ratio (SNR).

Exemplary embodiments of the present invention provide a method of controlling an audio system.

In exemplary embodiments of the present invention, an audio system performing a class-D amplification includes a first pulse width modulation (PWM) signal generation unit and a second PWM signal generation unit. The first PWM signal generation unit generates a first switching signal based on a first audio signal. The second PWM signal generation unit generates a second switching signal based on a second audio signal. The second switching signal has a frequency difference with respect to the first switching signal such that adverse influence of a harmonic frequency component generated by interference between the first switching signal and the second switching signal is removed. For example, the frequency difference may be a fixed value higher than 20 kHz so that the harmonic frequency component is removed from an audio band corresponding to 20 Hz through 20 kHz. The frequency difference may be set as a fixed value.

The first PWM signal generation unit may include a first feedback unit a first integration unit, a first low-pass filtering unit, a first phase delaying unit, and a first switching unit. The first feedback unit generates a first feedback signal based on the first switching signal. The first integration unit outputs a first integration signal based on the first feedback signal and the first audio signal, and the first integration signal has a pulse width corresponding to an amplitude of the first audio signal. The low-pass filtering unit outputs a first filtered signal based on the first integration signal by performing low-pass filtering. The first phase delaying unit delays a phase of the first filtered signal. The first switching unit generates a first PWM signal as the first switching signal based on the phase delayed first filtered signal.

The second PWM signal generation unit may include a second feedback unit, a second integration unit, a second low-pass filtering unit, a second phase delaying unit, and a second switching unit. The second feedback unit generates a second feedback signal based on the second switching signal. The second integration unit outputs a second integration signal based on the second feedback signal and the second audio signal, and the second integration signal has a pulse width corresponding to an amplitude of the second audio signal. The second low-pass filtering unit outputs a second filtered signal based on the second integration signal by performing the low-pass filtering. The second phase delaying unit delays a phase of the second filtered signal. The second switching unit generates a second PWM signal as the second switching signal based on the phase delayed second filtered signal.

In an exemplary embodiment, each of the first phase delaying unit and the second phase delaying unit may include an RC circuit.

When the first feedback signal or the second feedback signal corresponds to a first logic level, each of the first integration unit and the second integration unit may decrease an absolute value of a slope of the first integration signal or the second integration signal at a rising edge of the first audio signal or the second audio signal and may increase the absolute value of the slope of the first integration signal or the second integration signal at a falling edge of the first audio signal or the second audio signal. Moreover, when the first feedback signal or the second feedback signal corresponds to a second logic level, each of the first integration unit and the second integration unit may increase the absolute value of the slope of the first integration signal or the second integration signal at the rising edge of the first audio signal or the second audio signal and may decrease the absolute value of the slope of the first integration signal or the second integration signal at the falling edge of the first audio signal or the second audio signal.

When a level value of the first integration signal or the second integration signal is higher than a fixed value, each of the first switching unit and the second switching unit may output the first switching signal or the second switching signal having the first logic level. When the level value of the first integration signal or the second integration signal is lower than the fixed value, each of the first switching unit and the second switching unit may output the first switching signal or the second switching signal having the second logic level.

As an example, the first audio signal and the second audio signal may form a stereo signal pair.

In exemplary embodiments of the present invention, an audio system performing a class-D amplification includes a first PWM signal generation unit, a second PWM signal generation unit, and a control unit. The first PWM signal generation unit generates a first switching signal based on a first audio signal. The second PWM signal generation unit generates a second switching signal based on a second audio signal. The control unit controls a frequency difference between the first switching signal and the second switching signal. The frequency difference may be a predetermined value such that an adverse influence caused by a harmonic frequency component generated by interference between the first switching signal and the second switching signal is removed. For example, the frequency difference may be the predetermined value higher than 20 kHz so that the harmonic frequency component is removed from an audio band corresponding to 20 Hz through 20 kHz.

The first PWM signal generation unit may include a first feedback unit, a first integration unit, a first low-pass filtering unit, a first phase delaying unit, and a first switching unit. The first feedback unit generates a first feedback signal based on the first switching signal. The first integration unit outputs a first integration signal based on the first feedback signal and the first audio signal, and the first integration signal has a pulse width corresponding to the amplitude of the first audio signal. The first low-pass filtering unit outputs a first filtered signal based on the first integration signal by performing a low-pass filtering. The first phase delaying unit delays a phase of the first filtered signal. The first switching unit generates a first pulse width modulation signal as the first switching signal based on the phase delayed first filtered signal.

The second PWM signal generation unit may include a second feedback unit, a second integration unit, a second low-pass filtering unit, a second phase delaying unit, and a second switching unit. The second feedback unit generates a second feedback signal based on the second switching signal. The second integration unit outputs a second integration signal based on the second feedback signal and the second audio signal, and the second integration signal has a pulse width corresponding to the amplitude of the second audio signal. The second low-pass filtering unit outputs a second filtered signal based on the second integration signal by performing low-pass filtering. The second phase delaying unit delays a phase of the second filtered signal. The second switching unit generates a second PWM signal as the second switching signal based on the phase delayed second filtered signal.

In an exemplary embodiment, each of the first phase delaying unit and the second phase delaying unit may include an RC circuit.

The control unit can control the phases of the first integration signal and the second integration signal based on the low-pass filtered first integration signal and the low-pass filtered second integration signal. A phase difference between the first integration signal and the second integration signal may be a predetermined value such that an adverse influence caused by the harmonic frequency component generated by interference between the first switching signal and the second switching signal is removed.

When the first feedback signal or the second feedback signal corresponds to a first logic level, each of the first integration unit and the second integration unit may decrease an absolute value of a slope of the first integration signal or the second integration signal at a rising edge of the first audio signal or the second audio signal and may increase the absolute value of a slope of the first integration signal or the second integration signal at a falling edge of the first audio signal or the second audio signal. Moreover, when the first feedback signal or the second feedback signal corresponds to a second logic level, each of the first integration unit and the second integration unit may increase the absolute value of the slope of the first integration signal or the second integration signal at the rising edge of the first audio signal or the second audio signal and may decrease the absolute value of the slope of the first integration signal or the second integration signal at the falling edge of the first audio signal or the second audio signal.

When a level value of the first integration signal or the second integration signal is higher than a fixed value, each of the first switching unit and the second switching unit may output the first switching signal or the second switching signal having the first logic level. When the level value of the first integration signal or the second integration signal is lower than the fixed value, each of the first switching unit and the second switching unit may output the first switching signal or the second switching signal having the second logic level.

For example, the first audio signal and the second audio signal may form a stereo signal pair.

In a method of controlling an audio system performing a class-D amplification according to exemplary embodiments of the present invention, a first switching signal is generated based on a first audio signal. A second switching signal is generated based on a second audio signal. The second switching signal has a frequency difference from the first switching signal such that an adverse influence caused by a harmonic frequency component generated by interference between the first switching signal and the second switching signal is removed. For example, the frequency difference may be a fixed value higher than 20 kHz so that the harmonic frequency component is removed from an audio band corresponding to 20 Hz through 20 kHz.

In generating the first switching signal, a first feedback signal may be generated based on the first switching signal. A first integration signal may be outputted based on the first feedback signal and the first audio signal, and the first integration signal may have a pulse width corresponding to an amplitude of the first audio signal. A first filtered signal may be outputted from the first integration signal. A phase of the first filtered signal may be delayed. A first PWM signal may be generated as the first switching signal based on the phase delayed first filtered signal.

In generating the second switching signal, a second feedback signal may be generated based on the second switching signal. A second integration signal may be outputted based on the second feedback signal, and the second integration signal may be required for determining a pulse width corresponding to an amplitude of the second audio signal. A second filtered signal may be outputted from the second integration signal. A phase of the second filtered signal may be delayed. A second PWM signal may be generated as the second switching signal based on the phase delayed second filtered signal.

In each step of outputting the first integration signal and the second integration signal, when the first feedback signal or the second feedback signal corresponds to a first logic level, an absolute value of a slope of the first integration signal or the second integration signal may be decreased at a rising edge of the first audio signal or the second audio signal, and the absolute value of the slope of the first integration signal or the second integration signal may be increased at a falling edge of the first audio signal or the second audio signal. Moreover, when the first feedback signal or the second feedback signal corresponds to a second logic level, the absolute value of the slope of the first integration signal or the second integration signal may be increased at the rising edge of the first audio signal or the second audio signal, and the absolute value of the slope of the first integration signal or the second integration signal may be decreased at the falling edge of the first audio signal or the second audio signal.

In generating the first PWM signal and the second PWM signal as the first switching signal and the second switching signal, when a level value of the first integration signal or the second integration signal is higher than a fixed value, the first switching signal or the second switching signal having the first logic level may be outputted. When the level value of the first integration signal or the second integration signal is lower than the fixed value, the first switching signal or the second switching signal having the second logic level may be outputted.

As an example, the first audio signal and the second audio signal may form a stereo signal pair.

In a method of controlling an audio system performing a class-D amplification according to exemplary embodiments of the present invention, a first switching signal is generated based on a first audio signal, and a second switching signal is generated based on a second audio signal. A frequency difference between the first switching signal and the second switching signal is controlled to have a predetermined value such that an adverse influence caused by a harmonic frequency component generated by interference between the first switching signal and the second switching signal is removed. For example, the frequency difference may be a predetermined value higher than 20 kHz, so that the harmonic frequency component is removed from an audio band corresponding to 20 Hz through 20 kHz.

In generating the first switching signal, a first feedback signal may be generated based on the first switching signal. A first integration signal may be outputted based on the first feedback signal and the first audio signal, and the first integration signal may have a pulse width corresponding to an amplitude of the first audio signal. A first filtered signal may be outputted from the first integration signal by performing low-pass filtering. A phase of the first filtered signal may be delayed. A first PWM signal may be generated as the first switching signal based on the phase delayed first filtered signal.

In generating the second switching signal, a second feedback signal may be generated based on the second switching signal. A second integration signal may be outputted based on the second feedback signal and the second audio signal, and the second integration signal may have a pulse width corresponding to an amplitude of the second audio signal. A second filtered signal may be outputted based on the second integration signal by performing low-pass filtering. A phase of the second filtered signal may be delayed. A second PWM signal may be generated as the second switching signal based on the phase delayed second filtered signal.

In controlling the frequency difference between the first switching signal and the second switching signal, phases of the first integration signal and the second integration signal may be controlled based on the low-pass filtered first integration signal and the low-pass filtered second integration signal, such that an adverse influence of the harmonic frequency component generated by interference between the first switching signal and the second switching signal is removed.

In delaying the phases of the first integration signal and the second integration signal, when the first feedback signal or the second feedback signal corresponds to the first logic level, an absolute value of a slope of the first integration signal or the second integration signal may be decreased at a rising edge of the first audio signal or the second audio signal, and the absolute value of the slope of the first integration signal or the second integration signal may be increased at a falling edge of the first audio signal or the second audio signal. Moreover, when the first feedback signal or the second feedback signal corresponds to the second logic level, the absolute value of the slope of the first integration signal or the second integration signal may be increased at the rising edge of the first audio signal or the second audio signal, and the absolute value of the slope of the first integration signal or the second integration signal may be decreased at the falling edge of the first audio signal or the second audio signal.

In generating the first PWM signal and the second PWM signal as the first switching signal and the second switching signal, when a level value of the first at integration signal or the second integration signal is higher than a fixed value such that the harmonic frequency component generated by interference between the first switching signal and the second switching signal is removed, the first switching signal or the second switching signal having the first logic level may be outputted. When the level value of the first integration signal or the second integration signal is lower than the fixed value, the first switching signal or the second switching signal having the second logic level may be outputted.

As an example, the first audio signal and the second audio signal may form a stereo signal pair.

Consequently, according to an exemplary embodiment of the present invention, the audio system performing the class-D amplification and the method of controlling the same may improve the SNR by minimizing adverse effects caused by interference of the audio signals. Moreover, the audio system performing the class-D amplification and the method of controlling the same may increase the SNR by controlling the frequency difference between the stereo signals.

BRIEF DESCRIPTION OF THE DRAWINGS

Exemplary embodiments of the present invention will be understood in more detail from the following descriptions taken in conjunction with the attached drawings.

DESCRIPTION OF EXEMPLARY EMBODIMENTS

Exemplary embodiments of the present invention now will be described more fully with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so to that this disclosure will be thorough and complete, and will fully convey the scope of the invention to those of ordinary skill in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

Figure 2:
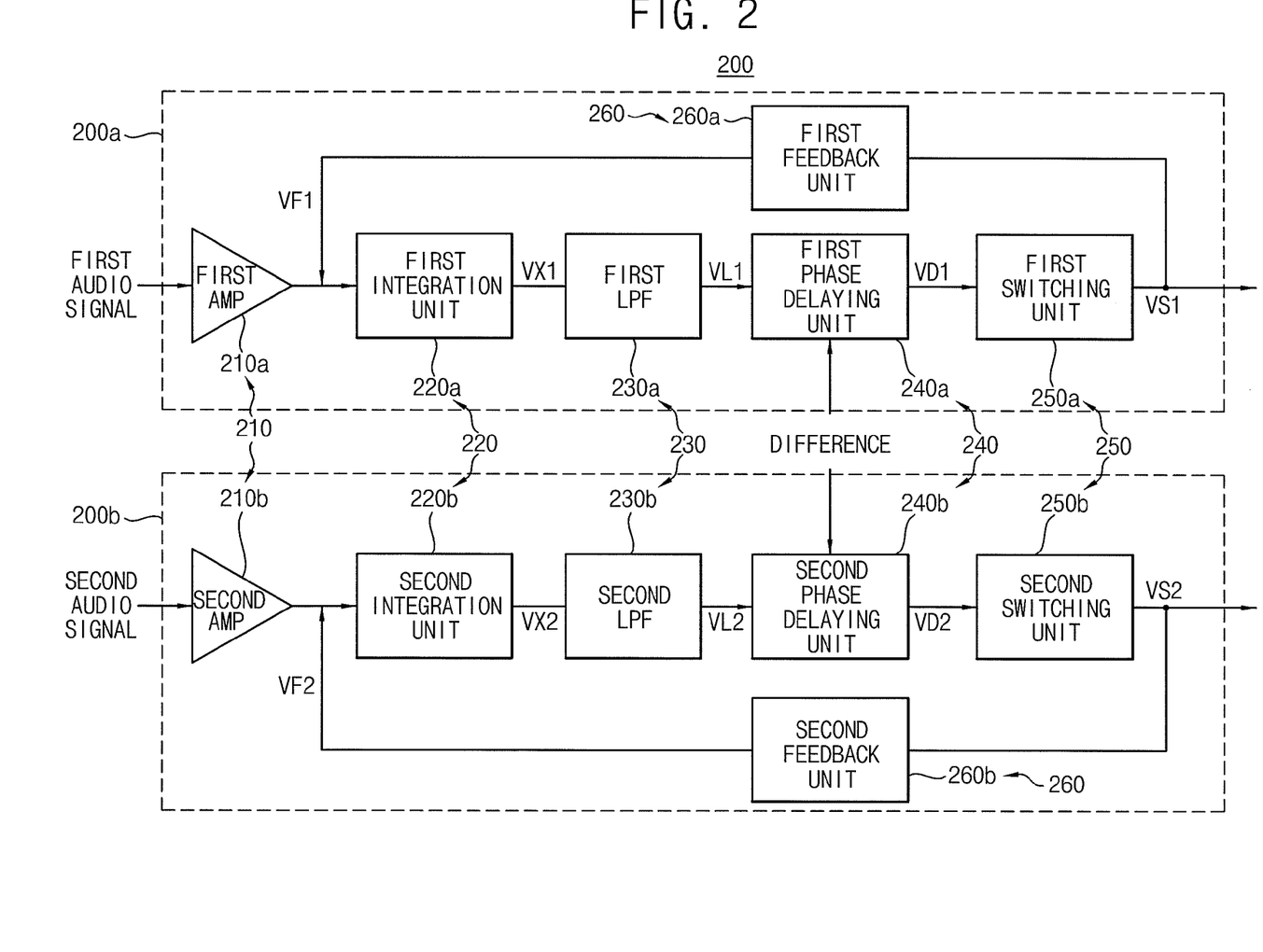
FIG. 2 is a block diagram illustrating an audio system performing a class-D amplification according to an exemplary embodiment of the present invention.

FIG. 2 is a block diagram illustrating an audio system performing a class-D amplification according to an exemplary embodiment of the present invention.

Referring to FIG. 2, an audio system 200 performing class-D amplification includes a first pulse width modulation (PWM) signal generation unit 200a and a second PWM signal generation unit 200b. The audio system 200 may be included in the player 140 shown in FIG. 1.

The first PWM signal generation unit 200a includes a first amplification unit 210a, a first integration unit 220a, a first low-pass filtering unit 230a, a first phase delaying unit 240a, a first switching unit 250a, and a first feedback unit 260a. The first PWM signal generation unit 200a generates a first switching signal VS1 based on a first audio signal input thereto. The second PWM signal generation unit 200b includes a second amplification unit 210b, a second integration unit 220b, a second low-pass filtering unit 230b, a second phase delaying unit 240b, a second switching unit 250b, and a second feedback unit 260b. The second PWM signal generation unit 200b generates a second switching signal VS2 based on a second audio signal input thereto.

Operations of the first PWM signal generation unit 200a and the second PWM signal generation unit 200b are substantially the same except for the first phase delaying unit 240a and the second phase delaying unit 240b, and thus the description of the first PWM signal generation unit 200a and the second PWM signal generation unit 200b will be merged. This does not mean, however, that the first PWM signal generation unit 200a and the second PWM signal generation unit 200b should have exactly the same physical structure.

An amplification unit 210 formed of the first amplification unit 210a and the second amplification unit 210b receives the first audio signal and the second audio signal, hereinafter referred to as "the audio signal," and amplifies the audio signal. In case that the audio signal having a sufficiently high level is provided, the amplification unit 210 may be omitted.

An integration unit 220 formed of the first integration unit 220a and the second integration unit 220b outputs a first integration signal VX1 and a second integration signal VX2, hereinafter referred to as "the integration signal VX," based on the first audio signal and the second audio signal and a first feedback signal VF1 and a second feedback signal VF2, hereinafter referred to as "the feedback signal VF," outputted from the feedback unit 260 formed of the first feedback unit 260a and the second feedback unit 260b. The integration signal VX is required for determining a pulse width corresponding to an amplitude of the audio signal.

The low-pass filtering unit 230 formed of the first low-pass filtering unit 230a and the second low-pass filtering unit 230b outputs a first filtered signal VL1 and a second filtered signal VL2, hereinafter, referred to as "the filtered signal VL," based on the integration signal VX by performing low-pass filtering.

A phase delaying unit 240 is formed of the first phase delaying unit 240a and the second phase delaying unit 240b that delay phases of the first filtered signal VL1 and the second filtered signal VL2 so that the first switching signal VS1 and second switching signal VS2 may have a predetermined frequency difference. The phase delaying units 240a and 240b may be implemented using an RC circuit (not shown). The predetermined frequency difference may be a fixed value for removing an adverse influence of a harmonic frequency component caused by interference between the first switching signal VS1 and the second switching signal VS2.

For example, the predetermined frequency difference may be higher than about 20 kHz so that adverse effects of the harmonic frequency component may be removed by being located out of an audio band corresponding to 20 Hz through 20 kHz. The audio system 200 performing class-D amplification illustrated in FIG. 2 may set the predetermined frequency difference by adjusting the physical circuit configuration of the first phase delaying unit 240a and the second phase delaying unit 240b. For example, the resistances and/or capacitances of the RC circuits (not shown) in the first phase delaying unit 240a and the second phase delaying unit 240b may be fixed such that the first switching signal VS1 and the second switching signal VS2 may have the predetermined frequency difference with respect to each other.

A switching unit 250 formed of the first 250a and second 250b switching units generates a first PWM signal and a second PWM signal, hereinafter referred to as "the PWM signal," as the first switching signal VS1 and the second switching signal VS2, hereinafter referred to as "the switching signal VS," based on the phase delayed first filtered signal VD1 and the phase delayed second filtered signal VD2, hereinafter referred to as "the phase delayed filtering signal VD," delayed by the phase delaying unit 240.

The feedback unit 260 generates the feedback signal VF based on the switching signal VS.

As described above, the audio system 200 shown in FIG. 2 performing class-D amplification generates the first switching signal VS1 based on the first audio signal and generates the second switching signal VS2 based on the second audio signal. The second switching signal VS2 has a frequency difference with respect to the first switching signal VS1. The frequency difference is determined so that a harmonic frequency component generated by interference between the first switching signal VS1 and the second switching signal VS2 may be removed out of the audio band. For example, the frequency difference may be a fixed value higher than an audio band corresponding to 20 Hz through 20 kHz. The first audio signal and the second audio signal may form a stereo signal pair.

In general the frequency difference can be achieved, because in each PWM signal generating unit 200a or 200b, there are several values for controlling the frequency of the switching signal VS1 or VS2. More specifically, such values are represented by an RC value of the low-pass filter unit 230a or 230b, a resistance value of the feedback unit 260a or 260b, a capacitance value of the integration unit 220a or 220b and a delay amount of the phase delaying unit 240a or 240b.

In the phase delaying unit 240a or 240b, for example, rising edges or falling edges are selectively delayed, so that the frequency of the switching signal VS1 or VS2 may be changed. On the other hand, if both the rising edges and the failing edges are delayed, the frequency of the switching signal VS1 or VS2 would not be changed.

Hereinafter, operations of the integration unit 220, the phase delaying unit 240, and the switching unit 250 will be described referring to FIGS. 3 to 5.

Figure 3:
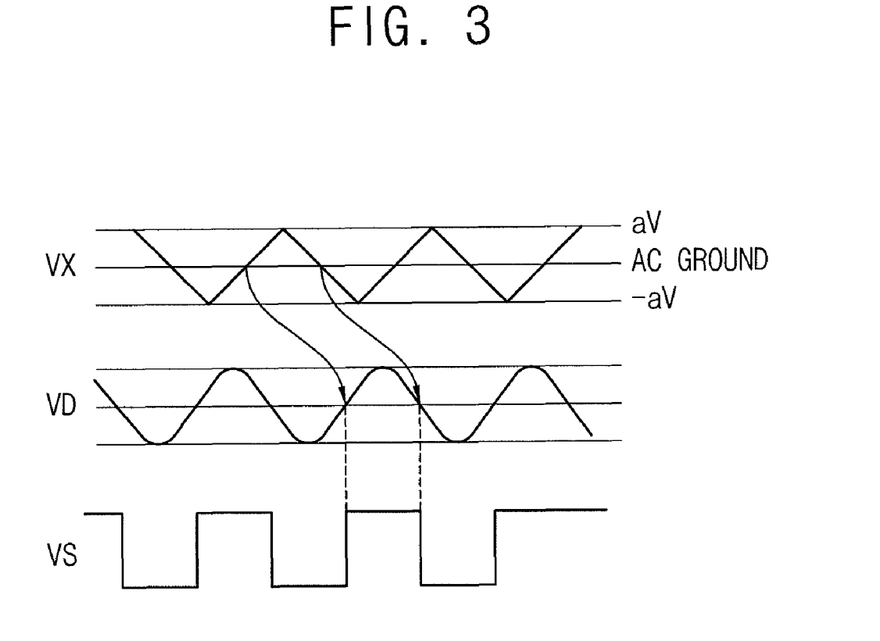
FIGS. 3 to 5 are timing diagrams illustrating signals outputted from each unit in FIG. 2.
Figure 4:
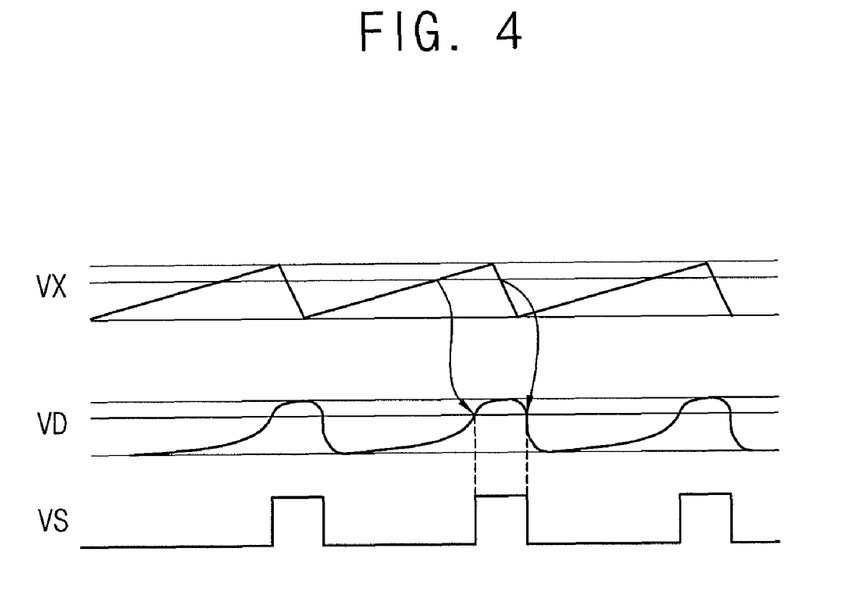
Figure 5:
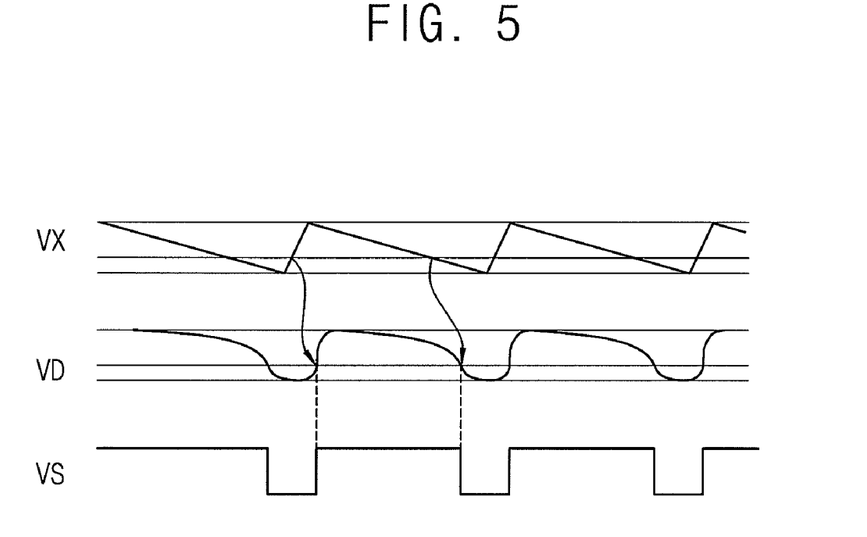

FIGS. 3 to 5 are timing diagrams illustrating signals outputted from the integration unit 220, the phase delaying unit 240, and the switching unit 250.

FIG. 3 illustrates a case where the input first audio signal or the input second audio signal is not fed to the integration unit 220, FIG. 4 illustrates a case where the feedback signal VF has a positive value, and FIG. 5 illustrates a case where the feedback signal VF has a negative value.

In FIGS. 3 to 5, when the feedback signal VF corresponds to a first logic level, for example, the positive value, the integration unit 220 decreases an absolute value of a slope of the integration signal VX at a rising edge of the audio signal and increases the absolute value of the slope of the integration signal VX at a falling edge of the audio signal, as illustrated in FIG. 4.

In FIGS. 3 to 5, when the feedback signal VF corresponds to a second logic level, for example, the negative value, the integration unit 220 increases the absolute value of the slope of the integration signal VX at the rising edge of the audio signal and decreases the absolute value of the slope of the integration signal VX at the falling edge of the audio signal, as illustrated in FIG. 5.

The low-pass filtering unit 230 outputs the filtered signal VL based on the integration signal VX by performing low-pass filtering. The phase delaying unit 240 outputs the phase delayed filtered signal VD by delaying the filtered signal VL.

When a level value of the integration signal VX is higher than a fixed value, the switching unit 250 outputs a switching signal VS having the first logic level. When the level value of the integration signal VX is lower than the fixed value, the switching unit 250 outputs the switching signal VS having the second logic level.

Figure 6:
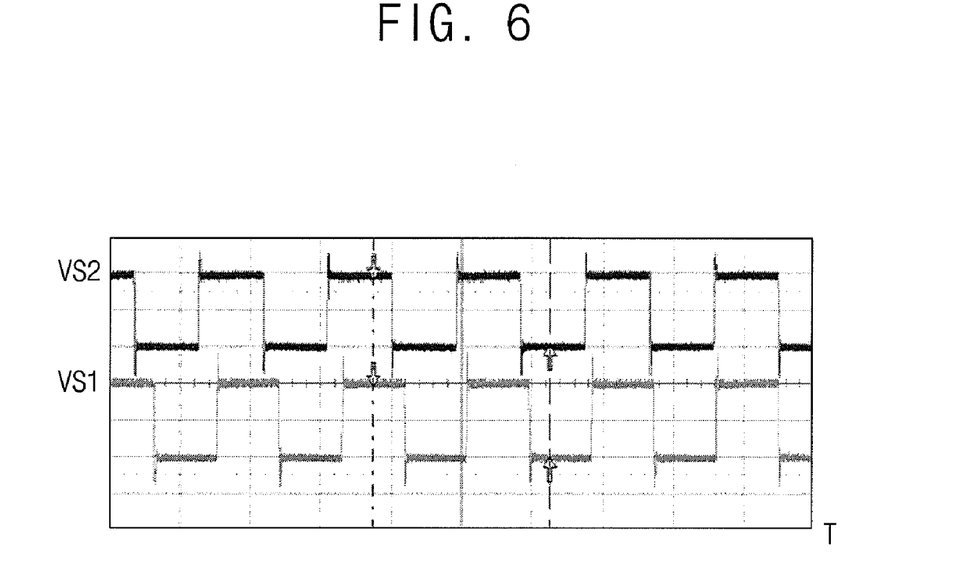
FIG. 6 is a timing diagram illustrating switching signals generated by a conventional stereo audio system performing class-D amplification.
Figure 7:
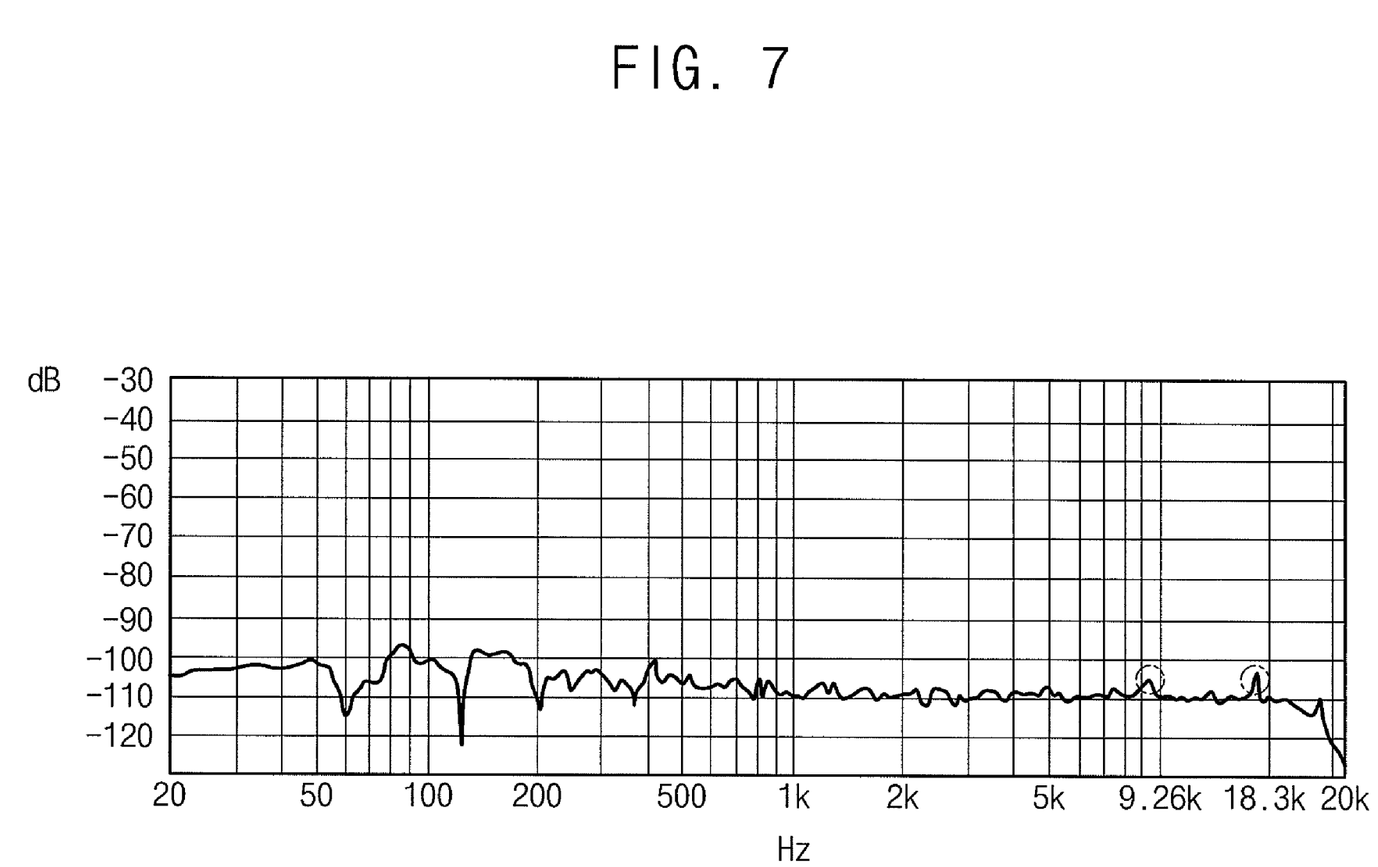
FIG. 7 is a timing diagram illustrating output signals generated based on the switching signals shown in FIG. 6.

FIG. 6 is a timing diagram illustrating switching signals generated by a conventional stereo audio system (not shown) performing class-D amplification, and FIG. 7 is a frequency diagram illustrating an output signal generated based on a sum of the two conventional switching signals shown in FIG. 6.

Referring to FIG. 6, the frequency difference between the two switching signals corresponds to approximately 9.7 kHz. That is, in FIG. 6 the plot is sealed by 0.4 μs and the period of the second switching signal VS1 is about 3.536 μs and the period of the first switching signal VS1 is about 3.536 μs and the period of the second switching signal is about 3.66 μs. Thus, the frequency of the first switching signal VS1 is about 282.824 kHz, and the frequency of the second switching signal VS2 is about 272.142 kHz. Therefore, the frequency difference is 9.7 kHz. Noise exists approximately at 9.26 kHz and 18.3 kHz of an output signal as illustrated by the dashed-line circles at those frequencies in FIG. 7. As such, the harmonic frequency component generated by interference between the first switching signal VS1 and the second switching signal VS2 exists in the audio band, and thus a signal to noise ratio (SNR) is degraded.

Figure 8:
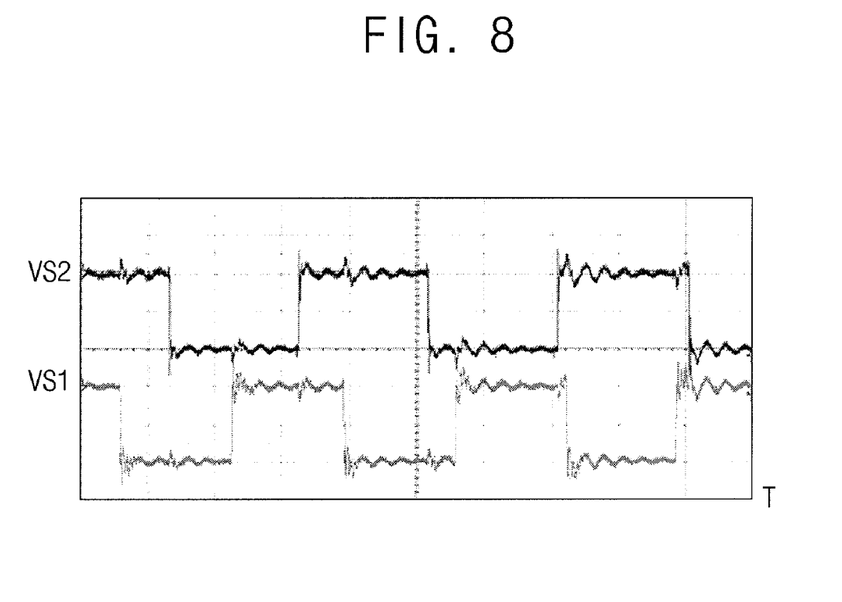
FIG. 8 is a timing diagram illustrating switching signals generated by the audio system of FIG. 2 performing class-D amplification.
Figure 9:
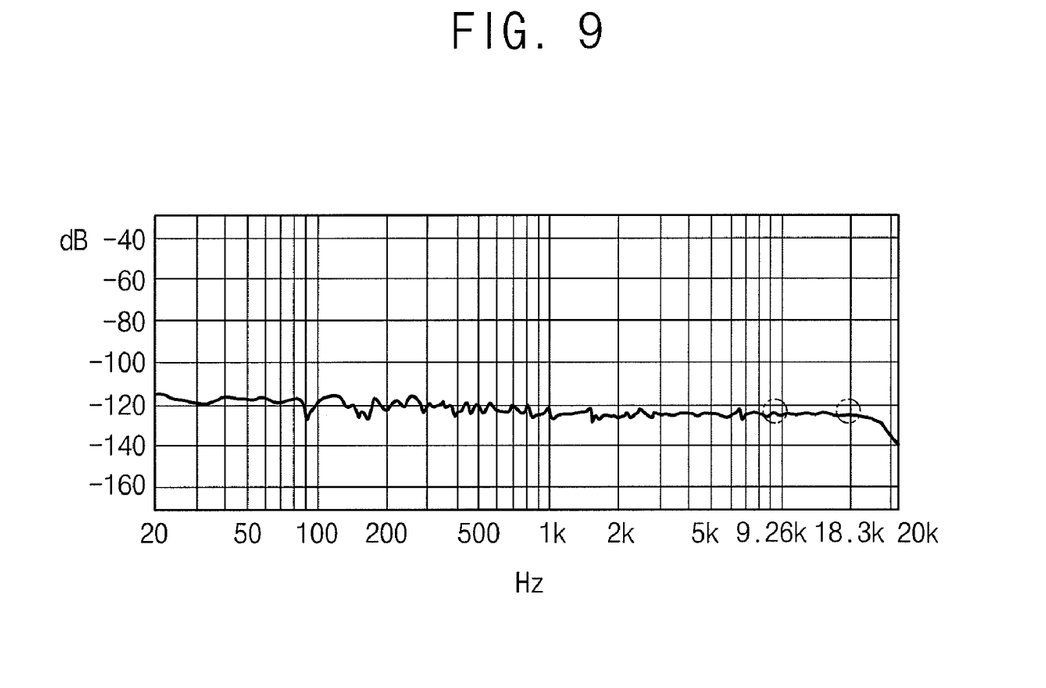
FIG. 9 is a timing diagram illustrating output signals generated based on the switching signals shown in FIG. 8.

FIG. 8 is a timing diagram illustrating switching signals generated by the audio system of FIG. 2 performing class-D amplification, and FIG. 9 is a frequency diagram illustrating an output signal generated based on a sum of the two switching signals VS1 and VS2 shown in FIG. 8.

Referring to FIG. 8, the frequency difference between the two switching signals corresponds to approximately 87 kHz, and the harmonic frequency component does not occur in the audio band as illustrated in FIG. 9, because there is no noise present at the locations of the two dashed-line circles. That is, the audio system 200 performing the class-D amplification may improve the SNR by setting the frequency difference higher, so that the interference is out of the audio band.

In FIG. 8, the plot is scaled by 0.1 μs, so that the period of the first switching signal VS1 is about 1.647 μs, and the period of the second switching signal VS2 is about 1.92 μs. Thus, the frequency of the first switching signal VS1 is about 607.265 kHz, and the frequency of the second switching signal VS2 is about 520.744 kHz, resulting in a frequency difference of 87 kHz.

Figure 10:
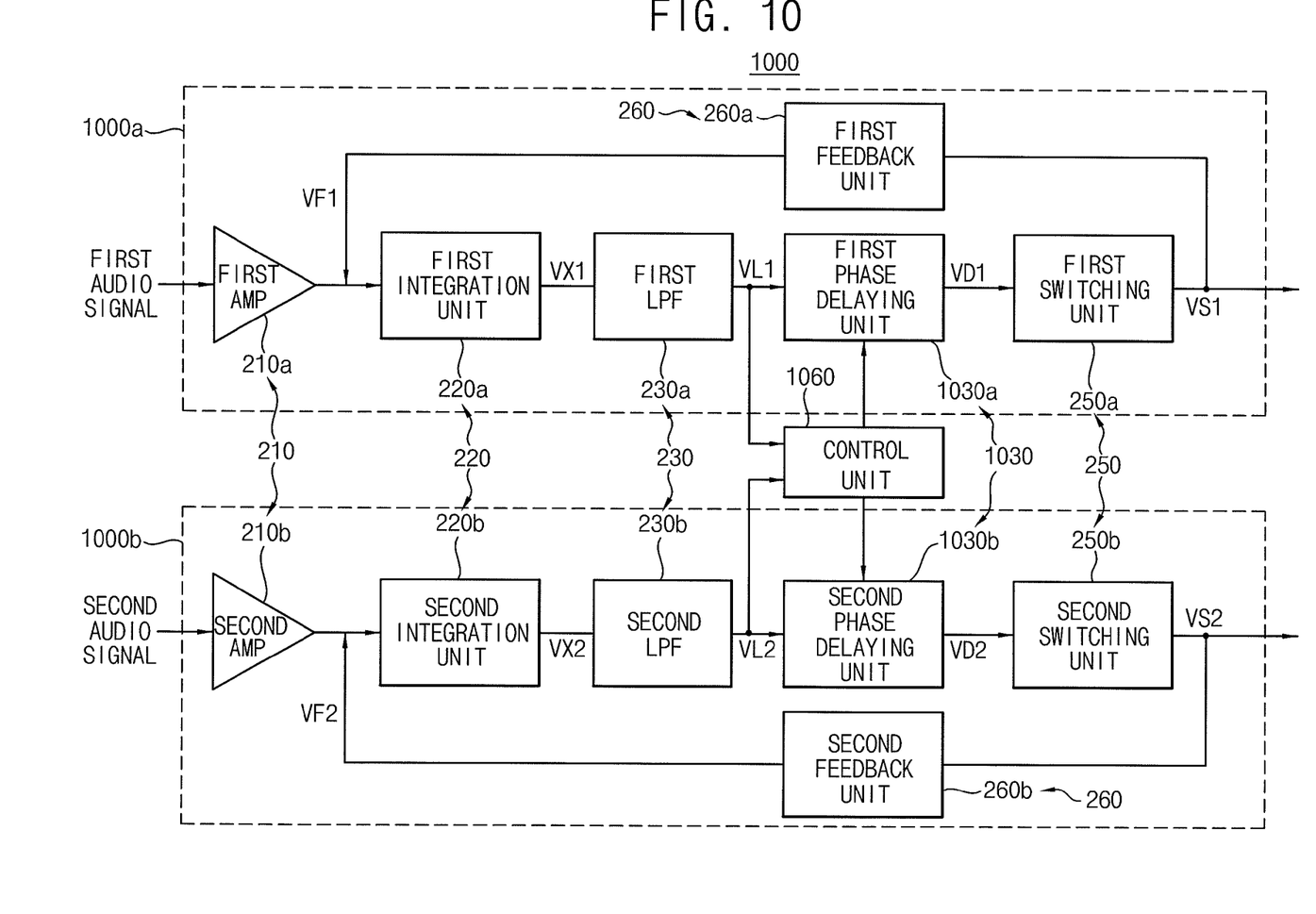
FIG. 10 a block diagram illustrating an audio system according to an exemplary embodiment of the present invention.

FIG. 10 is a block diagram illustrating an audio system performing class-D amplification according to an exemplary embodiment of the present invention.

Referring to FIG. 10, the audio system 1000 performing class-D amplification includes a first PWM signal generation unit 1000a, a second PWM signal generation unit 1000b, and a control unit 1060.

The audio system 1000 performing class-D amplification and the audio system 200 performing the class-D amplification of FIG. 2 have substantially the same structure except for a phase delaying unit 1030 formed of a first phase delaying unit 1030a and a second phase delaying unit 1030b, and the control unit 1060. Accordingly, a repeated description will be omitted except for the first phase delaying unit 1030a, the second phase delaying unit 1030b, and the control unit 1060.

The control unit 1060 controls the frequency difference of the first switching signal VS1 and the second switching signal VS2. The frequency difference is a predetermined value such that the harmonic frequency component caused by interference between the first switching signal VS1 and the second switching signal VS2 will be outside of the audio band. For example, the control unit 1060 controls the first phase delaying unit 1030a and the second phase delaying unit 1030b based on the first filtered signal VL1 and the second filtered signal VL2, so that the frequency difference may be higher than about 20 kHz.

The first phase delaying unit 1030a and the second phase delaying unit 1030b controls the phase of the first filtered signal VL1 and the second filtered signal VL2, respectively, based on control signals received from the control unit 1060.

The audio system performing class-D amplification may be implemented in a static structure, as illustrated in FIG. 2, and alternatively the audio system performing the class-D amplification may be implemented in a dynamic structure, as illustrated in FIG. 10. Accordingly, the audio system 200 of FIG. 2 may be efficient as regards manufacturing cost, and the audio system 1000 performing the class-D amplification of FIG. 10 may be efficient as regards the SNR by dynamically controlling the frequency differences as needed.

The SNR may be improved by reducing interference noises between the audio signals. Moreover, the SNR of stereo signals may be improved by controlling the frequency difference between the stereo signals according to exemplary embodiments of the present invention.

While exemplary embodiments of the present invention and their advantages have been described in detail, it should be understood that various changes, substitutions and alterations may be made herein without departing from the scope of the present invention.

What is claimed is:

1. An audio system performing a class-D amplification, comprising:
    a first pulse width modulation (PWM) signal generation unit configured to generate a first switching signal based on a first audio signal; and
    a second PWM signal generation unit configured to generate a second switching signal based on a second audio signal, the second switching signal having a frequency difference with respect to the first switching signal such that a harmonic frequency component generated by interference between the first switching signal and the second switching signal is removed.

2. The audio system of claim 1, wherein the frequency difference is a fixed value higher than 20 kHz so that the harmonic frequency component is removed out of an audio band corresponding to 20 Hz through 20 kHz.

3. The audio system of claim 1, wherein the frequency difference is set as a fixed value.

4. The audio system of claim 1, wherein the first PWM signal generation unit comprises:
    a first feedback unit configured to generate a first feedback signal based on the first switching signal;
    a first integration unit configured to output a first integration signal based on the first feedback signal and the first audio signal, the first integration signal determining a pulse width corresponding to an amplitude of the first audio signal;
    a first low-pass filtering unit configured to output a first filtered signal based on the first integration signal by performing a low-pass filtering;
    a first phase delaying unit configured to delay a phase of the first filtered signal; and
    a first switching unit configured to generate a first PWM signal as the first switching signal based on the phase delayed first filtered signal.

5. The audio system of claim 4, wherein the second PWM signal generation unit comprises:
    a second feedback unit configured to generate a second feedback signal based on the second switching signal;
    a second integration unit configured to output a second integration signal based on the second feedback signal and the second audio signal the second integration signal determining a pulse width corresponding to an amplitude of the second audio signal;
    a second low-pass filtering unit configured to output a second filtered signal based on the second integration signal by performing low-pass filtering;
    a second phase delaying unit configured to delay a phase of the second filtering signal; and
    a second switching unit configured to generate a second PWM signal as the second switching signal based on the phase delayed second filtered signal.

6. The audio system of claim 5, wherein each of the first phase delaying unit and the second phase delaying unit includes an RC circuit.

7. The audio system of claim 5, wherein each of the first integration unit and the second integration unit is configured to:
    decrease an absolute value of a slope of the first integration signal or the second integration signal at a rising edge of the first audio signal or the second audio signal and increase the absolute value of the slope of the first integration signal or the second integration signal at a falling edge of the first audio signal or the second audio signal, when the first feedback signal or the second feedback signal corresponds to a first logic level; and
    increase the absolute value of the slope of the first integration signal or the second integration signal at the rising edge of the first audio signal or the second audio signal and decrease the absolute value of the slope of the first integration signal or the second integration signal at the falling edge of the first audio signal or the second audio signal, when the first feedback signal or the second feedback signal corresponds to a second logic level.

8. The audio system of claim 7, wherein each of the first switching unit and the second switching unit is configured to output:
    the first switching signal or the second switching signal having the first logic level, when a level value of the first integration signal or the second integration signal is higher than a fixed value; and
    the first switching signal or the second switching signal having the second logic level, when the level value of the first integration signal or the second integration signal is lower than the fixed value.

9. The audio system of claim 1, wherein the first audio signal and the second audio signal form a stereo signal pair.

10. An audio system performing a class-D amplification, comprising:
    a first pulse width modulation (PWM) signal generation unit configured to generate a first switching signal based on a first audio signal;
    a second PWM signal generation unit configured to generate a second switching signal based on a second audio signal; and
    a control unit configured to control a frequency difference between the first switching signal and the second switching signal, the frequency difference being a predetermined value such that a harmonic frequency component generated by interference between the first switching signal and the second switching signal is removed.

11. The audio system of claim 10, wherein the predetermined value of the frequency difference is higher than 20 kHz so that the harmonic frequency component is removed from an audio band corresponding to 20 Hz through 20 kHz.

12. The audio system of claim 10, wherein the first PWM signal generation unit comprises:
    a first feedback unit configured to generate a first feedback signal based on a first switching signal;
    a first integration unit configured to output a first integration signal based on the first feedback signal and the first audio signal, the first integration signal determining a pulse width corresponding to an amplitude of the first audio signal;

a first low-pass filtering unit configured to output a first filtered signal based on the first integration signal by performing low-pass filtering;

a first phase delaying unit configured to delay a phase of the first filtered signal; and a first switching unit configured to generate a first PWM signal as the first switching signal based on the phase delayed first filtered signal.

13. The audio system of claim 12, wherein the second PWM signal generation unit comprises:

at a second feedback unit configured to generate a second feedback signal based on the second switching signal;

a second integration unit configured to output a second integration signal based on the second feedback signal and the second audio signal, the second integration signal determining a pulse width corresponding to an amplitude of the second audio signal;

a second low-pass filtering unit configured to output a second filtered signal based on the second integration signal by performing low-pass filtering;

a second phase delaying unit configured to delay a phase of the second filtered signal; and a second switching unit configured to generate a second PWM signal as the second switching signal based on the phase delayed second filtered signal.

14. The audio system of claim 13, each of the first phase delaying unit and the second phase delaying unit includes an RC circuit.

15. The audio system of claim 13, wherein the control unit is configured to control phases of the first filtered signal and the second filtered signal, wherein a phase difference between the first filtered signal and the second filtered signal has a predetermined value such that a harmonic frequency component generated by interference between the first switching signal and the second switching signal is removed.

16. The audio system of claim 15, wherein each of the first integration unit and the second integration unit is configured to:

decrease an absolute value of a slope of the first integration signal or the second integration signal at a rising edge of the first audio signal or the second audio signal and increase the absolute value of the slope of the first integration signal or the second integration signal at a falling edge of the first audio signal or the second audio signal, when the first feedback signal or the second feedback signal corresponds to a first logic level; and increase the absolute value of the slope of the first integration signal or the second integration signal at the rising edge of the first audio signal or the second audio signal and decrease the absolute value of the slope of the first integration signal or the second integration signal at the falling edge of the first audio signal or the second audio signal, when the first feedback signal or the second feedback signal corresponds to a second logic level.

17. The audio system of claim 16, wherein each of the first switching unit and the second switching unit is configured to output:

the first switching signal or the second switching signal having the first logic level, when a level value of the first integration signal or the second integration signal is higher than a fixed value; and the first switching signal or the second switching signal having the second logic level, when the level value of the first integration signal or the second integration signal is lower than the fixed value.

18. The audio system of claim 17, wherein the first audio signal and the second audio signal form a stereo signal pair.

* * * * *